United States Patent
Kato et al.

(10) Patent No.: US 10,480,067 B2
(45) Date of Patent: Nov. 19, 2019

(54) FILM DEPOSITION METHOD

(71) Applicant: Tokyo Electron Limited, Tokyo (JP)

(72) Inventors: Hitoshi Kato, Iwate (JP); Masahiro Murata, Iwate (JP); Jun Sato, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/420,333

(22) Filed: Jan. 31, 2017

(65) Prior Publication Data

US 2017/0218510 A1  Aug. 3, 2017

(30) Foreign Application Priority Data

Feb. 3, 2016 (JP) ................ 2016-018546

(51) Int. Cl.
| | |
|---|---|
| *C23C 16/24* | (2006.01) |
| *C23C 16/50* | (2006.01) |
| *C23C 16/34* | (2006.01) |
| *C23C 16/455* | (2006.01) |
| *H01J 37/32* | (2006.01) |

(52) U.S. Cl.
CPC ...... *C23C 16/345* (2013.01); *C23C 16/45536* (2013.01); *C23C 16/45551* (2013.01); *H01J 37/32* (2013.01)

(58) Field of Classification Search
CPC ............ C23C 16/345; C23C 16/45536; C23C 16/45551; H01J 37/32
USPC ....................................................... 427/569
See application file for complete search history.

(56) References Cited

U.S. PATENT DOCUMENTS

| | | | |
|---|---|---|---|
| 4,854,266 | A | 8/1989 | Simson et al. |
| 5,281,274 | A | 1/1994 | Yoder |
| 5,620,523 | A | 4/1997 | Maeda et al. |
| 5,744,049 | A | 4/1998 | Hills et al. |
| 5,849,088 | A | 12/1998 | DeDontney et al. |
| 5,906,354 | A | 5/1999 | Gilbert et al. |
| 6,279,503 | B1 | 8/2001 | Choi et al. |

(Continued)

FOREIGN PATENT DOCUMENTS

| | | |
|---|---|---|
| CN | 1269046 | 10/2000 |
| CN | 101076878 | 11/2007 |

(Continued)

*Primary Examiner* — Katherine A Bareford
*Assistant Examiner* — Christina D McClure
(74) *Attorney, Agent, or Firm* — IPUSA, PLLC

(57) ABSTRACT

A film deposition method for filling a recessed pattern with a SiN film is provided. $NH_2$ groups are caused to adsorb on a surface of a substrate containing a recessed pattern formed in a top surface of the substrate by supplying a first process gas containing $NH_3$ converted to first plasma to the surface of the substrate containing the recessed pattern. The $NH_2$ groups is partially converted to N groups by supplying a second process gas containing $N_2$ converted to second plasma to the surface of the substrate containing the recessed pattern on which the $NH_2$ groups is adsorbed. A silicon-containing gas is caused to adsorb on the $NH_2$ groups by supplying the silicon-containing gas to the surface of the substrate containing the recessed pattern on which the $NH_2$ groups and the N groups are adsorbed. The above steps are cyclically repeated.

10 Claims, 10 Drawing Sheets

(56) References Cited

U.S. PATENT DOCUMENTS

| | | | |
|---|---|---|---|
| 6,340,501 B1 | 1/2002 | Kamiyama et al. | |
| 6,634,314 B2 | 10/2003 | Hwang et al. | |
| 6,933,245 B2 | 8/2005 | Lee et al. | |
| 7,153,542 B2 | 12/2006 | Nguyen et al. | |
| 8,034,723 B2 | 10/2011 | Ohizumi et al. | |
| 8,092,598 B2 | 1/2012 | Baek et al. | |
| 8,372,202 B2 | 2/2013 | Kato et al. | |
| 8,465,591 B2 | 6/2013 | Kato et al. | |
| 8,465,592 B2 | 6/2013 | Kato et al. | |
| 8,518,183 B2 | 8/2013 | Honma | |
| 8,673,079 B2 | 3/2014 | Kato et al. | |
| 8,673,395 B2 | 3/2014 | Kato et al. | |
| 8,721,790 B2 | 5/2014 | Kato et al. | |
| 8,746,170 B2 | 6/2014 | Orito et al. | |
| 8,808,456 B2 | 8/2014 | Kato et al. | |
| 8,835,332 B2 | 9/2014 | Kato et al. | |
| 8,840,727 B2 | 9/2014 | Kato et al. | |
| 8,845,857 B2 | 9/2014 | Ohizumi et al. | |
| 8,854,449 B2 | 10/2014 | Aikawa et al. | |
| 8,882,915 B2 | 11/2014 | Kato et al. | |
| 8,882,916 B2 | 11/2014 | Kumagai et al. | |
| 8,906,246 B2 | 12/2014 | Kato et al. | |
| 8,951,347 B2 | 2/2015 | Kato et al. | |
| 8,961,691 B2 | 2/2015 | Kato et al. | |
| 8,962,495 B2 | 2/2015 | Ikegawa et al. | |
| 8,992,685 B2 | 3/2015 | Kato et al. | |
| 9,023,738 B2 | 5/2015 | Kato et al. | |
| 9,040,434 B2 | 5/2015 | Kato | |
| 9,053,909 B2 | 6/2015 | Kato et al. | |
| 9,103,030 B2 | 8/2015 | Kato et al. | |
| 9,111,747 B2 | 8/2015 | Yamawaku et al. | |
| 9,136,133 B2 | 9/2015 | Oshimo et al. | |
| 9,214,333 B1 | 12/2015 | Sims et al. | |
| 9,714,467 B2 | 7/2017 | Kato et al. | |
| 2002/0195056 A1 | 12/2002 | Sandhu et al. | |
| 2003/0228770 A1 | 12/2003 | Lee et al. | |
| 2004/0052972 A1 | 3/2004 | Schmitt | |
| 2006/0014384 A1 | 1/2006 | Lee et al. | |
| 2006/0177579 A1 | 8/2006 | Shin et al. | |
| 2006/0196538 A1 | 9/2006 | Kubista et al. | |
| 2006/0269693 A1 | 11/2006 | Balseanu et al. | |
| 2007/0215036 A1 | 9/2007 | Park et al. | |
| 2007/0218701 A1 | 9/2007 | Shimizu et al. | |
| 2007/0218702 A1 | 9/2007 | Shimizu et al. | |
| 2008/0207007 A1* | 8/2008 | Thridandam | C23C 16/401 438/778 |
| 2008/0208385 A1 | 8/2008 | Sakamoto et al. | |
| 2008/0216864 A1 | 9/2008 | Sexton et al. | |
| 2009/0272402 A1 | 11/2009 | Kim et al. | |
| 2009/0324826 A1 | 12/2009 | Kato et al. | |
| 2009/0324828 A1 | 12/2009 | Kato et al. | |
| 2010/0050942 A1 | 3/2010 | Kato et al. | |
| 2010/0050943 A1 | 3/2010 | Kato et al. | |
| 2010/0050944 A1 | 3/2010 | Kato et al. | |
| 2010/0055297 A1 | 3/2010 | Kato et al. | |
| 2010/0055312 A1 | 3/2010 | Kato et al. | |
| 2010/0055314 A1 | 3/2010 | Kato et al. | |
| 2010/0055315 A1 | 3/2010 | Honma | |
| 2010/0055316 A1 | 3/2010 | Honma | |
| 2010/0055319 A1 | 3/2010 | Kato et al. | |
| 2010/0055320 A1 | 3/2010 | Honma | |
| 2010/0055347 A1 | 3/2010 | Kato et al. | |
| 2010/0055351 A1 | 3/2010 | Kato et al. | |
| 2010/0116210 A1 | 5/2010 | Kato et al. | |
| 2010/0124610 A1 | 5/2010 | Aikawa et al. | |
| 2010/0132614 A1 | 6/2010 | Kato et al. | |
| 2010/0132615 A1 | 6/2010 | Kato et al. | |
| 2010/0136795 A1 | 6/2010 | Honma | |
| 2010/0151131 A1 | 6/2010 | Obara et al. | |
| 2011/0151122 A1 | 6/2011 | Kato et al. | |
| 2011/0155057 A1 | 6/2011 | Kato et al. | |
| 2011/0159187 A1 | 6/2011 | Kato et al. | |
| 2011/0159188 A1* | 6/2011 | Kato | C23C 16/34 427/255.394 |
| 2011/0159702 A1 | 6/2011 | Ohizumi et al. | |
| 2011/0214611 A1 | 9/2011 | Kato et al. | |
| 2011/0236598 A1 | 9/2011 | Kumagai et al. | |
| 2012/0075460 A1 | 3/2012 | Aikawa et al. | |
| 2012/0076937 A1 | 3/2012 | Kato et al. | |
| 2012/0222615 A1 | 9/2012 | Kato et al. | |
| 2012/0267341 A1 | 10/2012 | Kato et al. | |
| 2013/0059415 A1 | 3/2013 | Kato et al. | |
| 2013/0122718 A1 | 5/2013 | Kato et al. | |
| 2013/0164942 A1 | 6/2013 | Kato et al. | |
| 2013/0251904 A1 | 9/2013 | Kato et al. | |
| 2013/0337635 A1 | 12/2013 | Yamawaku et al. | |
| 2013/0337658 A1 | 12/2013 | Ikegawa et al. | |
| 2014/0017909 A1 | 1/2014 | Kato | |
| 2014/0170859 A1 | 6/2014 | Yamawaku et al. | |
| 2014/0174351 A1 | 6/2014 | Aikawa | |
| 2014/0199856 A1 | 7/2014 | Kato et al. | |
| 2014/0206133 A1 | 7/2014 | Koezuka et al. | |
| 2014/0213068 A1 | 7/2014 | Kato et al. | |
| 2014/0220260 A1 | 8/2014 | Yamawaku et al. | |
| 2014/0273527 A1* | 9/2014 | Niskanen | C23C 16/345 438/792 |
| 2014/0273530 A1 | 9/2014 | Nguyen et al. | |
| 2014/0345523 A1 | 11/2014 | Kikuchi et al. | |
| 2014/0349032 A1 | 11/2014 | Kato et al. | |
| 2015/0011087 A1 | 1/2015 | Oshimo et al. | |
| 2015/0024143 A1 | 1/2015 | Kumagai et al. | |
| 2015/0031218 A1 | 1/2015 | Karakawa | |
| 2015/0078864 A1 | 3/2015 | Sato et al. | |
| 2015/0079807 A1 | 3/2015 | Tamura et al. | |
| 2015/0184293 A1 | 7/2015 | Kato et al. | |
| 2015/0184294 A1 | 7/2015 | Kato et al. | |
| 2015/0187560 A1 | 7/2015 | Kim et al. | |
| 2015/0214029 A1 | 7/2015 | Hane et al. | |
| 2015/0225849 A1 | 8/2015 | Kato et al. | |
| 2016/0148800 A1* | 5/2016 | Henri | H01L 21/0228 438/485 |
| 2017/0218510 A1 | 8/2017 | Kato et al. | |
| 2017/0263437 A1 | 9/2017 | Li et al. | |
| 2018/0308681 A1 | 10/2018 | Harada et al. | |
| 2018/0350668 A1 | 12/2018 | Cheng et al. | |

FOREIGN PATENT DOCUMENTS

| | | |
|---|---|---|
| JP | H04-287912 | 10/1992 |
| JP | 3144664 | 3/2001 |
| JP | 2001-254181 | 9/2001 |
| JP | 2007-247066 | 9/2007 |
| JP | 2013-161874 | 8/2013 |
| JP | 2013-165116 | 8/2013 |
| JP | 2015-165549 | 9/2015 |
| WO | 2006/065014 | 6/2006 |
| WO | 2013/137115 | 9/2013 |

* cited by examiner

FILM DEPOSITION METHOD

CROSS-REFERENCE TO RELATED APPLICATIONS

This patent application is based upon and claims the benefit of priority of Japanese Patent Application No. 2016-18546, filed on Feb. 3, 2016, the entire contents of which are incorporated herein by reference.

BACKGROUND OF THE INVENTION

1. Field of the Invention

The present invention relates to a film deposition method.

2. Description of the Related Art

Conventionally, as described in Japanese Laid-Open Patent Application Publication No. 2015-165549, a substrate processing method is known that includes steps of causing a silicon-containing gas to adsorb on a surface of a substrate provided in a process chamber by supplying the silicon-containing gas to the substrate, performing a first plasma process on the substrate on which the silicon-containing gas is adsorbed by using first plasma generated from a first plasma processing gas containing hydrogen, and performing a second plasma process by using second plasma generated from a second plasma processing gas that does not contain hydrogen gas but contains ammonia gas on the substrate on which the first plasma process has been performed.

In such a film deposition method as described in Japanese Laid-Open Patent Application Publication No. 2015-165549, by performing the second plasma process using the second plasma having high ion energy and high radical concentration on the substrate after performing the first plasma process using the first plasma having low ion energy and low radical concentration, generation of a loading effect can be prevented, and a SiN film having excellent uniformity across the surface of the substrate can be deposited on the surface of the substrate.

However, in recent years, film deposition processes for filling a recessed pattern having a high aspect ratio such as a trench and a via hole with a film, are often required. Thus, film deposition processes for filling the recessed pattern having the high aspect ratio with the film with preferable bottom-up characteristics are widely required separately from the film deposition process conforming to the recessed pattern with the preferable uniformity across the surface of the substrate. In other words, when filling the recessed pattern having the high aspect ratio, if the film fills an upper portion of the recessed pattern more than the bottom portion of the recessed pattern and thereby blocks the upper portion of the recessed pattern, a void is liable to be generated in the film filling the recessed pattern. Accordingly, a film deposition method for gradually filling the recessed pattern with a film from the bottom portion without blocking the opening is required.

SUMMARY OF THE INVENTION

Embodiments of the present invention provide a method for processing a substrate and a substrate processing apparatus solving one or more of the problems discussed above.

More specifically, embodiments of the present invention provide a film deposition method for depositing a SiN film with high bottom-up characteristics and capable of performing selective film deposition.

According to one embodiment of the present invention, there is provided a film deposition method for filling a recessed pattern formed in a surface of a substrate with a SiN film. $NH_2$ groups are caused to adsorb on a surface of a substrate containing a recessed pattern formed in a top surface of the substrate by supplying a first process gas containing $NH_3$ converted to first plasma to the surface of the substrate containing the recessed pattern. The $NH_2$ groups is partially converted to N groups by supplying a second process gas containing $N_2$ converted to second plasma to the surface of the substrate containing the recessed pattern on which the $NH_2$ groups is adsorbed. A silicon-containing gas is caused to adsorb on the $NH_2$ groups by supplying the silicon-containing gas to the surface of the substrate containing the recessed pattern on which the $NH_2$ groups and the N groups are adsorbed. The above steps of causing the $NH_2$ groups to adsorb on the surface of the substrate, partially converting the $NH_2$ groups to the N groups and causing the silicon-containing gas to adsorb on the $NH_2$ groups are cyclically repeated.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments of the present invention are described below with reference to accompanying drawings.

[Configuration of Film Deposition Apparatus]

Figure 1:
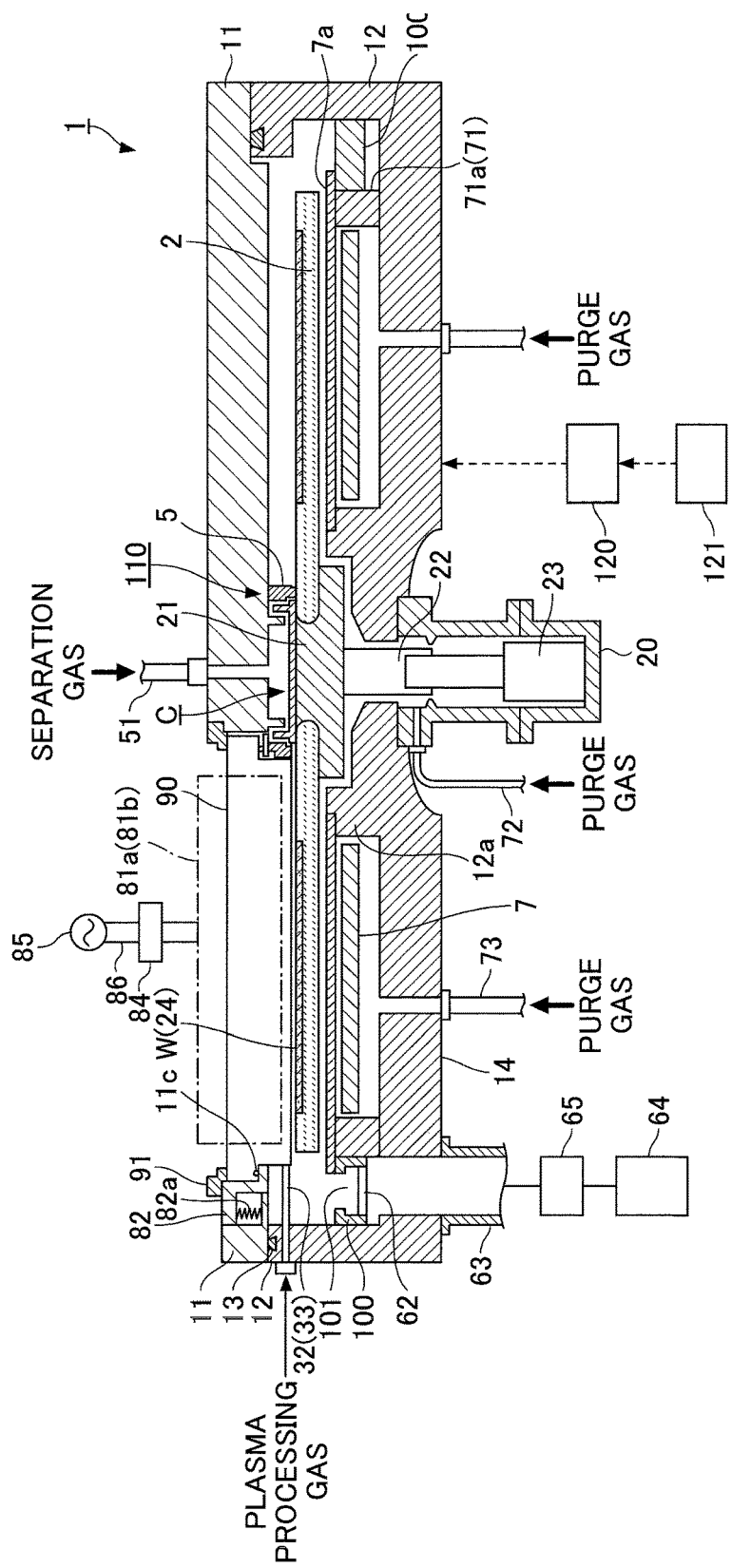
FIG. 1 is a schematic vertical cross-sectional view illustrating an example of a film deposition apparatus preferable to implement a film deposition method according to an embodiment of the present invention.
Figure 2:
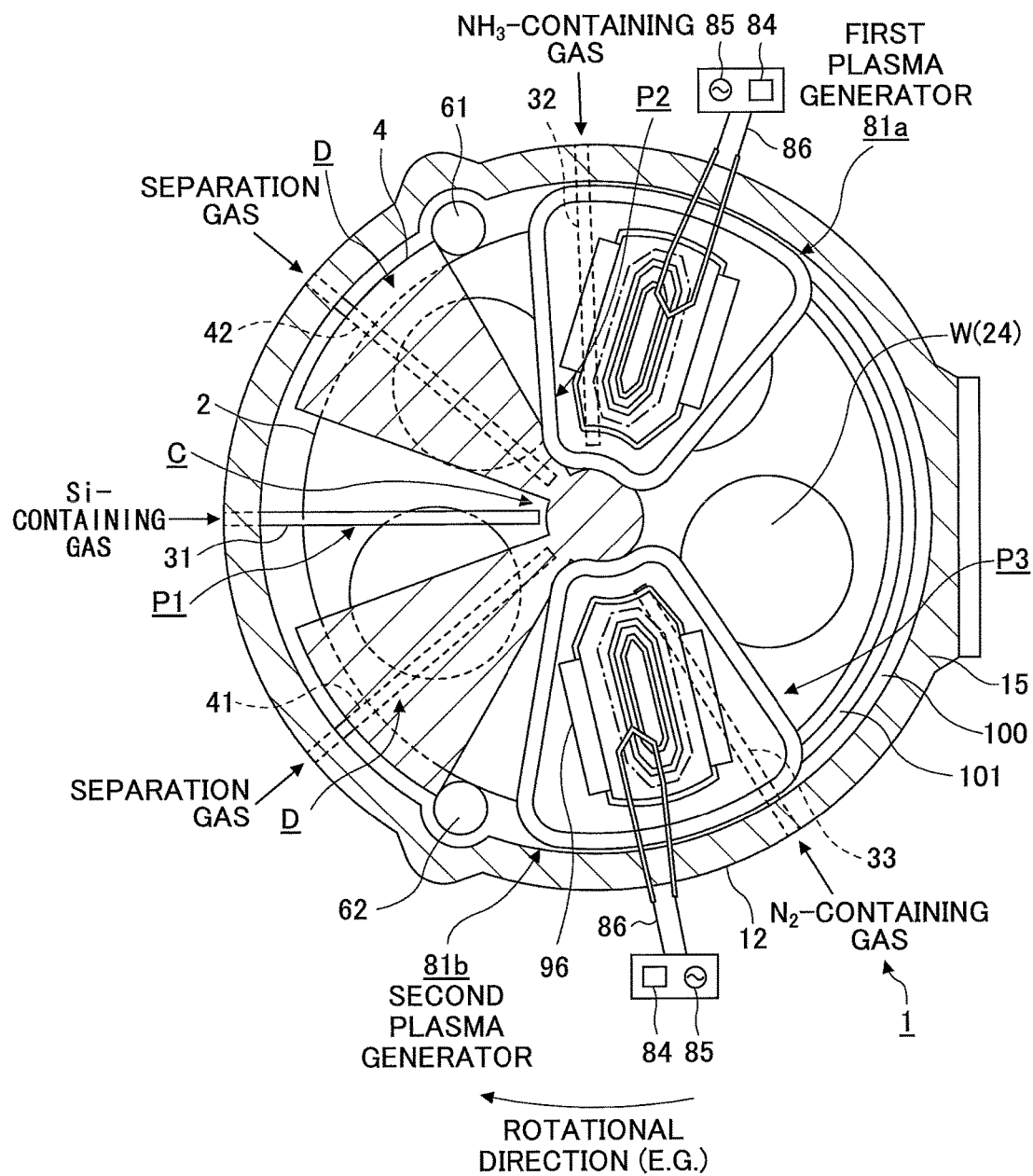
FIG. 2 is a schematic plan view illustrating an example of the film deposition apparatus in FIG. 1.

FIG. 1 is a schematic vertical cross-sectional view illustrating an example of a film deposition apparatus to implement a film deposition method according to an embodiment of the present invention. FIG. 2 is a schematic plan view illustrating an example of a film deposition apparatus to implement the film deposition method according to an embodiment of the present invention. Here, in FIG. 2, a depiction of a ceiling plate 11 is omitted for the purpose of illustration.

As illustrated in FIG. 1, the film deposition apparatus to implement the film deposition method according to the embodiment includes a vacuum chamber 1 having an approximately circular planar shape and a turntable 2 provided in the vacuum chamber 1 and having its rotational center that coincides with the center of the vacuum chamber 1 to rotate a wafer W placed thereon.

The vacuum chamber 1 is a process chamber for processing a substrate therein. The vacuum chamber 1 includes a ceiling plate (ceiling part) 11 provided in a position facing concave portions 24 of the turntable 2 that will be described later and a chamber body 12. Moreover, a seal member 13 having a ring-like shape is provided in a periphery in an upper surface of the chamber body 12. The ceiling plate 11 is configured to be detachable from the chamber body 12. A diameter dimension (inner diameter dimension) of the vacuum chamber 1 when seen in a plan view is not limited, but can be, for example, set at about 1100 mm.

A separation gas supply pipe 51 is connected to a central part in an upper surface of the ceiling plate 11 and is further in communication with a central part of an upper surface side in the vacuum chamber 1 through a hole to supply a separation gas for preventing different process gases from mixing with each other in a central area C.

The turntable 2 is fixed to a core portion 21 having an approximately cylindrical shape at the central part, and is configured to be rotatable by a drive unit 23 in a clockwise fashion as illustrated in FIG. 2 as an example, around a rotational shaft 22 connected to a lower surface of the core portion 21 and extending in a vertical direction, which forms a vertical axis. The diameter dimension of the turntable 2 is not limited, but can be set at, for example, about 1000 mm.

The rotational shaft 22 and the drive unit 23 are accommodated in a casing body 20, and a flange portion at an upper surface side of the casing body 20 is hermetically attached to a lower surface of a bottom portion of the vacuum chamber 1. A purge gas supply pipe 72 for supplying nitrogen gas or the like as a purge gas (separation gas) is connected to an area below the turntable 2.

A peripheral side of the core portion 21 in a bottom part 14 of the vacuum chamber 1 forms a protruding part 12a by being formed into a ring-like shape so as to come to close to the lower surface of the turntable 2.

As illustrated in FIG. 2, circular concave portions 24 are formed in a surface of the turntable 2 as a substrate receiving area to receive wafers W having a diameter dimension of, for example, 300 mm thereon. The concave portions 24 are provided at a plurality of locations, for example, at five locations along a rotational direction of the turntable 2. Each of the concave portions 24 has an inner diameter slightly larger than the diameter of the wafer W, more specifically, larger than the diameter of the wafer W by about 1 to 4 mm. Furthermore, the depth of each of the concave portions 24 is configured to be approximately equal to or greater than the thickness of the wafer W. Accordingly, when the wafer W is accommodated in the concave portion 24, the surface of the wafer W is as high as, or lower than a surface of the turntable 2 where the wafer W is not placed. Here, even when the depth of each of the concave portions 24 is greater than the thickness of the wafer W, the depth of each of the concave portions 24 is preferably equal to or smaller than about three times the thickness of the wafer W because too deep concave portions 24 may affect the film deposition.

Here, a recessed pattern such as a trench or a via hole is formed in a surface of the wafer W. The film deposition method according to the embodiment is a method preferable for filling any recessed pattern with a film. Hence, the film deposition method according to the embodiment can be preferably applied to the film deposition for filling the recessed pattern such as the trench and the via hole formed in the surface of the wafer W.

Through holes not illustrated in the drawings are formed in a bottom surface of the concave portion 24 to allow, for example, three lifting pins that will be described later to push up the wafer W from below and to lift the wafer W.

As illustrated in FIG. 2, for example, five nozzles 31, 32, 33, 41 and 42 each made of, for example, quartz are arranged in a radial fashion at intervals in the circumferential direction of the vacuum chamber 1 at respective positions opposite to a passing area of the concave portions 24. Each of the nozzles 31, 32, 33, 41 and 42 is arranged between the turntable 2 and the ceiling plate 11. These nozzles 31, 32, 33, 41 and 42 are each installed, for example, so as to horizontally extend facing the wafer W from an outer peripheral wall of the vacuum chamber 1 toward the central area C.

In the example illustrated in FIG. 2, a source gas nozzle 31, a separation gas nozzle 42, a first plasma processing gas nozzle 32, a second plasma processing gas nozzle 33, and a separation gas nozzle 41 are arranged in a clockwise fashion (in the rotational direction of the turntable 2) in this order. However, the substrate processing apparatus of the embodiments is not limited to this form, and the turntable 2 may rotate in a counterclockwise fashion. In this case, the source gas nozzle 31, the separation gas nozzle 42, the first plasma processing gas nozzle 32, the second plasma processing gas nozzle 33 and the separation gas nozzle 41 are arranged in this order in the counterclockwise fashion.

As illustrated in FIG. 2, plasma generators 81a and 81b are provided above the first plasma processing gas nozzle 32 and the second plasma processing gas nozzle 33, respectively, to convert plasma processing gases discharged from the respective plasma processing gas nozzles 32 and 33. The plasma generators 81a and 81b will be described later.

Here, in the embodiment, although an example of arranging a single nozzle in each process area is illustrated, a configuration of providing a plurality of nozzles in each process area is also possible. For example, the first plasma processing gas nozzle 32 may be constituted of a plurality of plasma processing gas nozzles, each of which is configured to supply argon (Ar) gas, ammonia ($NH_3$) gas, hydrogen ($H_2$) gas or the like, or may be constituted of only a single plasma processing gas nozzle configured to supply a mixed gas of argon gas, ammonia gas and hydrogen gas.

The source gas nozzle 31 forms a source process gas supply unit. Moreover, the first plasma processing gas nozzle 32 forms a first plasma processing gas supply unit, and the second plasma processing gas nozzle 33 forms a second plasma processing gas supply unit. Furthermore, each of the separation gas nozzles 41 and 42 forms a separation gas supply unit. Here, the separation gas may be referred to as a purge gas as described above.

Each of the nozzles 31, 32, 33, 41 and 42 is connected to each gas supply source not illustrated in the drawings through a flow control valve.

A source gas supplied from the source gas nozzle 31 is a silicon-containing gas. As an example of the silicon-containing gas, DCS [dichlorosilane], disilane ($Si_2H_6$), HCD [hexachlorodisilane], DIPAS [diisopropylamino-silane], 3DMAS [tris(dimethylamino)silane] gas, BTBAS [bis(tertiary-butyl-amino)silane] and the like are cited.

Also, a metal-containing gas may be used as an example of the source gas supplied from the source gas nozzle 31 other than the silicon-containing gas such as $TiCl_4$ [titanium tetrachloride], $Ti(MPD)(THD)_2$ [titanium methylpentanedionato bis(tetramethylheptanedionato)], TMA [trimethylaluminium], TEMAZ [Tetrakis(ethylmethylamino)zirconium], TEMHF [tetrakis (ethylmethylamino)hafnium], $Sr(THD)_2$ [strontium bis(tetramethylheptanedionato)] or the like.

An ammonia ($NH_3$) containing gas, which is a nitriding gas, is selected as the first plasma processing gases supplied from the first plasma processing gas nozzle 32. By using $NH_3$, $NH_2$ groups can be adsorbed on the surface of the wafer W containing the recessed pattern, and an adsorption site can be formed for the silicon-containing gas. Here, argon gas, helium (He) gas and the like may be contained in the ammonia-containing gas in addition to $NH_3$ as necessary. The mixed gas of these gases is supplied from the first plasma processing gas nozzle 32, and is converted to plasma by the first plasma generator 81a.

A nitrogen ($N_2$) containing gas is selected as the second plasma processing gas supplied from the second plasma processing gas nozzle 33 to convert a part of the $NH_2$ groups to N groups. By supplying $N_2$, a part of the $NH_2$ groups adsorbed on the surface of the wafer W is converted to the N groups, and a part of the adsorption site made of the $NH_2$ groups is caused to disappear. Thus, selective adsorption of the subsequently supplied source gas can be performed. More specifically, $N_2$ gas converted to plasma does not reach a deep portion (the bottom portion) of the recessed pattern, but H atoms are released from the $NH_2$ groups adsorbed on the top surface of the wafer W and an upper portion of the recessed pattern, thereby being converted to the N groups.

The $N_2$-containing gas may contain Ar gas, He gas and the like as necessary in addition to $N_2$ gas, and the mixed gas of these may be supplied from the second plasma processing gas nozzle 32 as the second plasma processing gas.

Thus, different gases are selected as the first plasma processing gas and the second plasma processing gas from each other.

For example, nitrogen ($N_2$) gas is used as the separation gas supplied from the separation gas nozzles 41 and 42.

As discussed above, in the example illustrated in FIG. 2, the source gas nozzle 31, the separation gas nozzle 42, the first plasma processing gas nozzle 32, the second plasma processing gas nozzle 33 and the separation gas nozzle 41 are arranged in this order in a clockwise fashion (in the rotational direction of the turntable 2). In other words, in an actual process of the wafer W, the wafer W having the surface containing the recessed pattern on which the Si-containing gas supplied from the first process gas nozzle 31 is adsorbed is sequentially exposed to the separation gas from the separation gas nozzle 42, the plasma processing gas from the first plasma processing gas nozzle 32, the plasma processing gas from the second plasma processing gas nozzle 33, and the separation gas from the separation gas nozzle 41 in this order.

Figure 3:
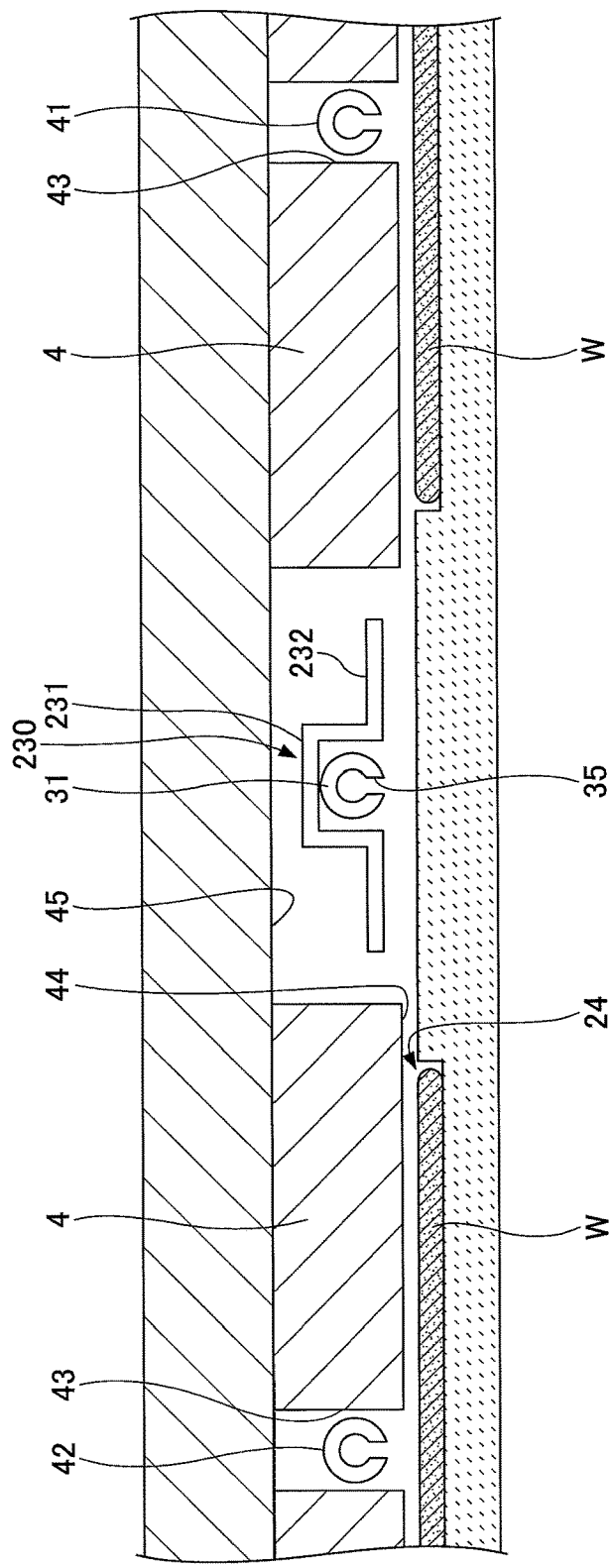
FIG. 3 is a cross-sectional view cut along a concentric circle of a turntable in the film deposition apparatus in FIG. 1.

As illustrated in FIG. 3, gas discharge holes 35 for discharging each of the above-mentioned gases are formed in each lower surface (the surface facing the turntable 2) of the gas nozzles 31, 32, 33, 41 and 42 along a radial direction of the turntable 2 at a plurality of locations, for example, at regular intervals. Each of the nozzles 31, 32, 33, 41 and 42 is arranged so that a distance between a lower end surface of each of the nozzles 31, 32, 33, 41 and 42 and an upper surface of the turntable 2 is set at, for example, about 1 to 5 mm.

An area under the first process gas nozzle 31 is a first process area P1 to cause the first process gas to adsorb on the wafer W. An area under the first plasma processing gas nozzle 32 is a second process area P2 to perform a first plasma process on a thin film on the wafer W, and an area under the second plasma processing gas nozzle 33 is a third process area P3 to perform a third plasma process on the thin film on the wafer W.

FIG. 3 illustrates a cross-sectional view cut along a concentric circle of the turntable 2 of the film deposition apparatus. Here, FIG. 3 illustrates the cross-sectional view from one of the separation area D to the other separation area D byway of the first process area P1.

As shown in FIG. 3, approximately sectorial convex portions 4 are provided on the ceiling plate 11 of the vacuum chamber 1 in the separation areas D. Flat low ceiling surfaces 44 (first ceiling surfaces) that are lower surfaces of the convex portions 4 and ceiling surfaces 45 (second ceiling surfaces) that are higher than the ceiling surfaces 44 provided on both sides of the ceiling surfaces 44 in a circumferential direction, are formed in the vacuum chamber 1.

As illustrated in FIG. 2, the convex portions 4 forming the ceiling surfaces 44 have a fan-like planar shape whose apexes are cut into an arc-like shape. Moreover, each of the convex portions 4 has a groove portion 43 formed so as to extend in the radial direction in the center in the circumferential direction, and each of the separation gas nozzles 41 and 42 is accommodated in the groove portion 43. Here, a periphery of each of the convex portions 4 (a location on the peripheral side of the vacuum chamber 1) is bent into a L-shaped form so as to face an outer edge surface of the turntable 2 and to be located slightly apart from the chamber body 12 in order to prevent each of the process gas from mixing with each other.

As illustrated in FIG. 3, a nozzle cover 230 is provided on the upper side of the source gas nozzle 31 in order to cause the source gas to flow along the wafer W and so as to cause the separation gas to flow through a location close to the ceiling plate 11 of the vacuum chamber 1 while flowing away from the neighborhood of the wafer W. As illustrated in FIG. 3, the nozzle cover 230 includes an approximately box-shaped cover body 231 whose lower surface side is open to accommodate the first process gas nozzle 31 and current plates 232 having a plate-like shape and connected to the lower open ends of the cover body 231 on both upstream and downstream sides in the rotational direction of the turntable 2. Here, a side wall surface of the cover body 231 on the rotational center side of the turntable 2 extends toward the turntable 2 (i.e., downward) so as to face a tip of the first process gas nozzle 31. In addition, the side wall surface of the cover body 231 on the peripheral side of the turntable 2 is cut off so as not to interfere with the first process gas nozzle 31.

Next, the first plasma generator 81a and the second plasma generator 81b provided above the first and second plasma processing gas nozzles 32 and 33 are described below in detail. Here, in the present embodiment, although each of the first plasma generator 81a and the second plasma generator 81b can perform an independent plasma treatment, each structure can be the same as each other.

Figure 4:
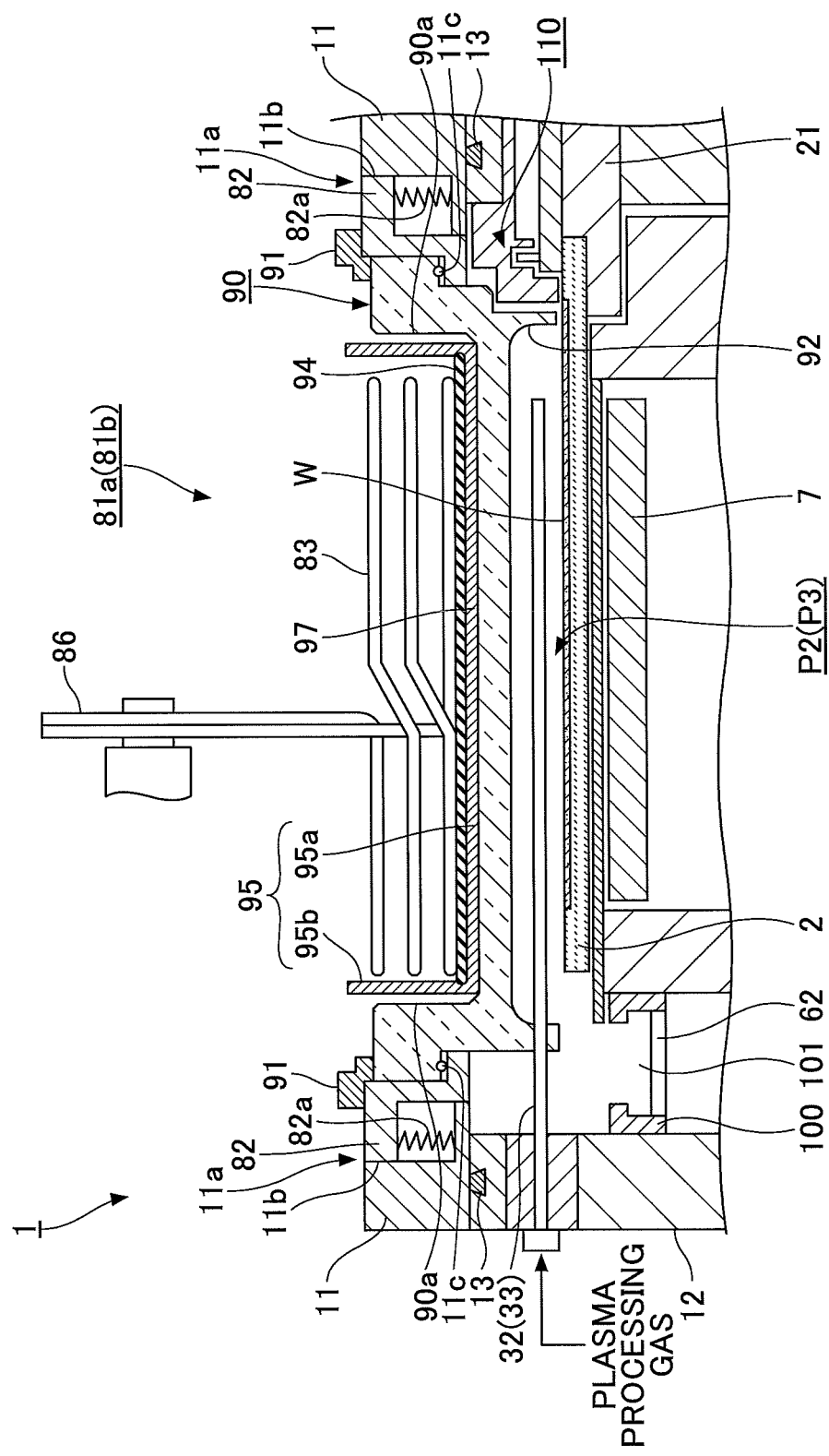
FIG. 4 is a vertical cross-sectional view illustrating an example of a plasma generator of the film deposition apparatus in FIG. 1.
Figure 5:
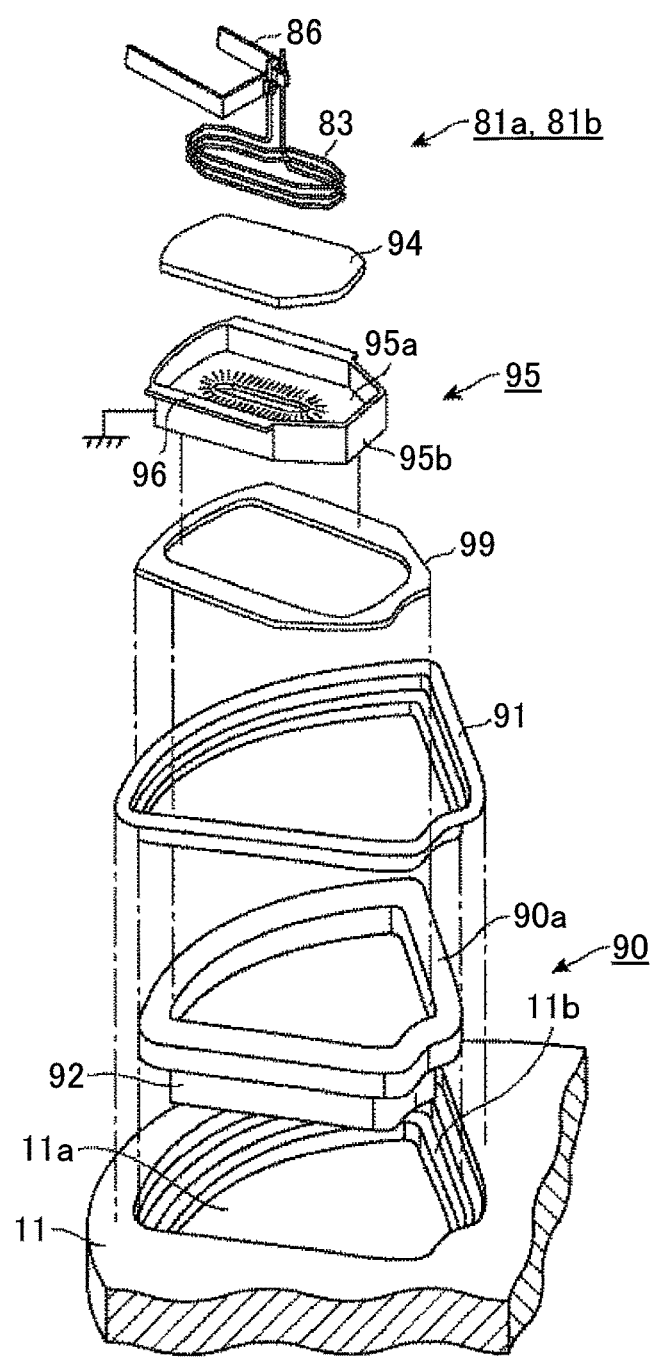
FIG. 5 is an exploded perspective view illustrating an example of the plasma generator of the film deposition apparatus in FIG. 1.
Figure 6:
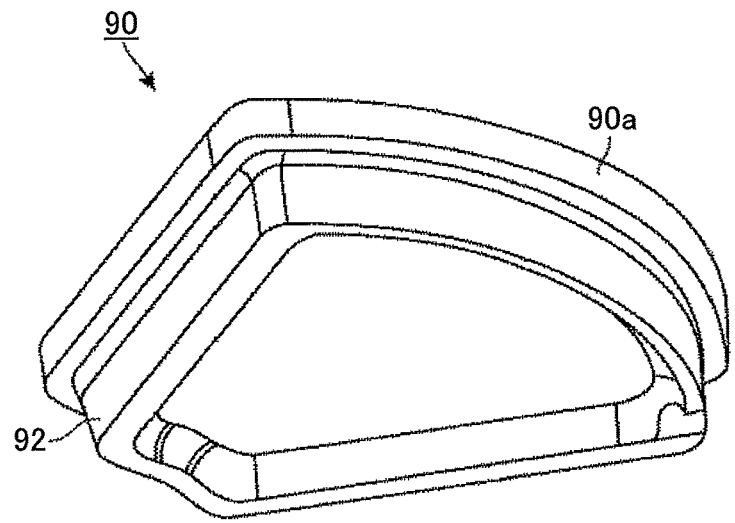
FIG. 6 is a perspective view illustrating an example of a housing provided in the plasma generator of the film deposition apparatus in FIG. 1.

FIG. 4 illustrates a vertical cross-sectional view of an example of the plasma generators 81a and 81b of the embodiment. Also, FIG. 5 illustrates an exploded perspective view of an example of the plasma generators 81a and 81b of the embodiment. Furthermore, FIG. 6 illustrates a perspective view of an example of a housing provided in the plasma generators 81a and 81b of the embodiment.

The plasma generators 81a and 81b are configured to wind an antenna 83 constituted of a metal wire or the like, for example, triply around the vertical axis. Moreover, as illustrated in FIG. 2, each of the plasma generators 81a and 81b is arranged so as to surround a band area extending in the radial direction of the turntable 2 when seen in a plan view and to cross the diameter of the wafer W on the turntable 2.

The antenna 83 is, for example, connected to a radio frequency power source 85 having a frequency of 13.56 MHz and output power of 5000 W via a matching box 84. Then, the antenna 83 is provided to be hermetically separated from an inner area of the vacuum chamber 1. Here, a connection electrode 86 is provided to electrically connect the antenna 83 with the matching box 84 and the radio frequency power source 85.

As illustrated in FIGS. 4 and 5, an opening 11a having an approximately fan-like shape when seen in a plan view is formed in the ceiling plate 11 above the first plasma processing gas nozzle 32.

As illustrated in FIG. 4, an annular member 82 is hermetically provided in the opening 11a along the verge of the opening 11a. The housing 90 that will be described later is hermetically provided on the inner surface side of the annular member 82. In other words, the annular member 82 is hermetically provided at a position where the outer peripheral side of the annular member 82 faces the inner surface 11b of the opening 11a in the ceiling plate 11 and the inner peripheral side of the annular member 82 faces a flange part 90a of the housing 90 that will be described later. The housing 90 made of, for example, a derivative of quartz is provided in the opening 11a through the annular member 82 in order to arrange the antenna 83 at a position lower than the ceiling plate 11.

Moreover, as illustrated in FIG. 4, the annular member 82 includes a bellows 82a expandable in the vertical direction. Furthermore, the plasma generators 81a and 81b are formed to be able to move up and down independently of each other by a drive mechanism (elevating mechanism) not illustrated in the drawings such as an electric actuator or the like. By causing the bellows 82a to extend and contract in response to the rise and fall of the plasma generators 81a and 81b, each distance between each of the plasma generators 81a and 81b and the wafer W (i.e., turntable 2) (which may be referred to as a distance of a plasma generation space) can be changed during the plasma treatment.

As illustrated in FIG. 6, the casing 90 is configured to have a peripheral part horizontally extending along the circumferential direction on the upper side so as to form the flange part 90a and a central part recessed toward the inner area of the vacuum chamber 1 when seen in a plan view.

The housing 90 is arranged to cross the diameter of the wafer W in the radial direction of the turntable 2 when the wafer W is located under the housing 90. Here, as illustrated in FIG. 4, a seal member 11c such as an O-ring or the like is provided between the annular member 82 and the ceiling plate 11.

An internal atmosphere of the vacuum chamber 1 is sealed by the annular member 82 and the housing 90. More specifically, the annular member 82 and the housing 90 are set in the opening 11a, and then the housing 90 is pressed downward through the whole circumference by a pressing member 91 formed into a frame-like shape along the contact portion of the annular member 82 and the housing 90. Furthermore, the pressing member 91 is fixed to the ceiling plate 11 by volts and the like not illustrated in the drawings. This causes the internal atmosphere of the vacuum chamber 1 to be sealed. Here, in FIG. 5, a depiction of the annular member 82 is omitted for simplification.

As illustrated in FIG. 6, a projection portion 92 vertically extending toward the turntable 2 is formed in a lower surface of the housing 90 so as to surround each of the process areas P2 and P3 under the housing 90 along each circumferential direction thereof. Then, the first plasma processing gas nozzle 32 and the second plasma processing gas nozzle 33 are accommodated in an area surrounded by an inner circumferential surface of the projection portion 92, the lower surface of the housing 90 and the upper surface of the turntable 2. Here, the projection portion 92 at the base end portion (the inner wall side of the vacuum chamber 1) of each of the first plasma processing gas nozzle 32 and the second plasma processing gas nozzle 33 is cut off so as to be formed into an approximately arc-like shape along each of the first plasma processing gas nozzle 32 and the second plasma processing gas nozzle 33.

As illustrated in FIG. 4, the projection portion 92 is formed on the lower side of the housing 90 along the circumferential direction thereof. The seal member 11c is not exposed to the plasma due to the projection portion 92, and that is to say, is separated from the plasma generation space. Thus, even if the plasma is likely to diffuse, for example, to the seal member 11c side, because the plasma goes toward the seal member 11c by way of the lower side of the projection portion 92, the plasma becomes inactivated before reaching the seal member 11c.

A grounded Faraday shield 95 that is formed so as to approximately fit along an inner shape of the housing 90 and is made of a conductive plate-like body, for example, a metal plate such as a copper plate and the like, is installed in the housing 90. The Faraday shield 95 includes a horizontal surface 95a horizontally formed so as to be along the bottom surface of the housing 90 and a vertical surface 95b extending upward from the outer edge of the horizontal surface 95a through the whole circumference, and may be configured to be approximately hexagon when seen in a plan view.

Figure 7:
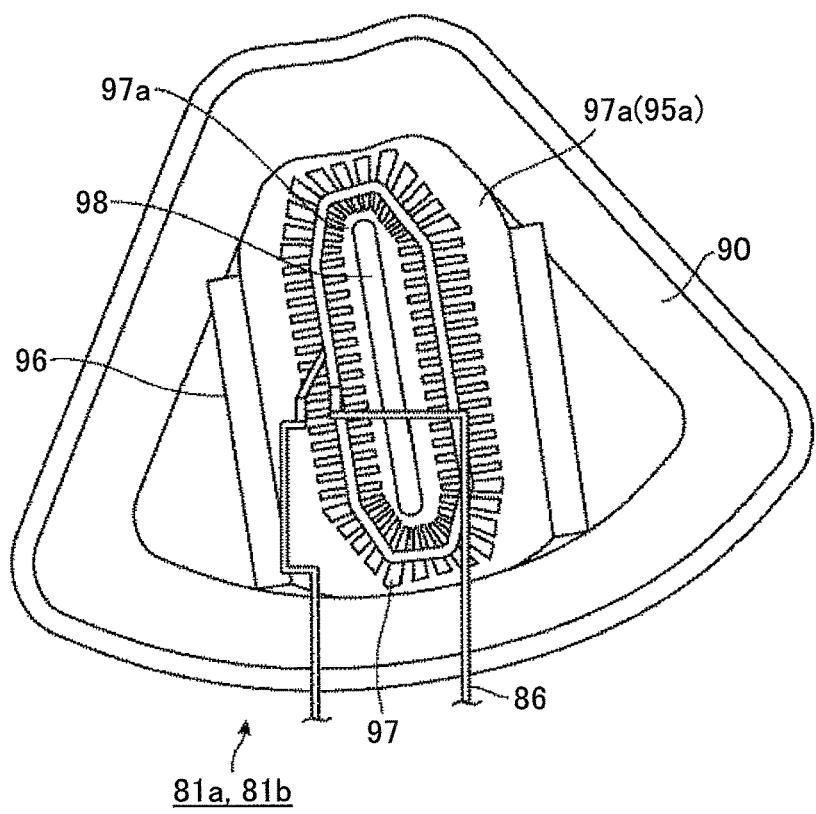
FIG. 7 is a plan view illustrating an example of the plasma generator of the film deposition apparatus in FIG. 1.
Figure 8:
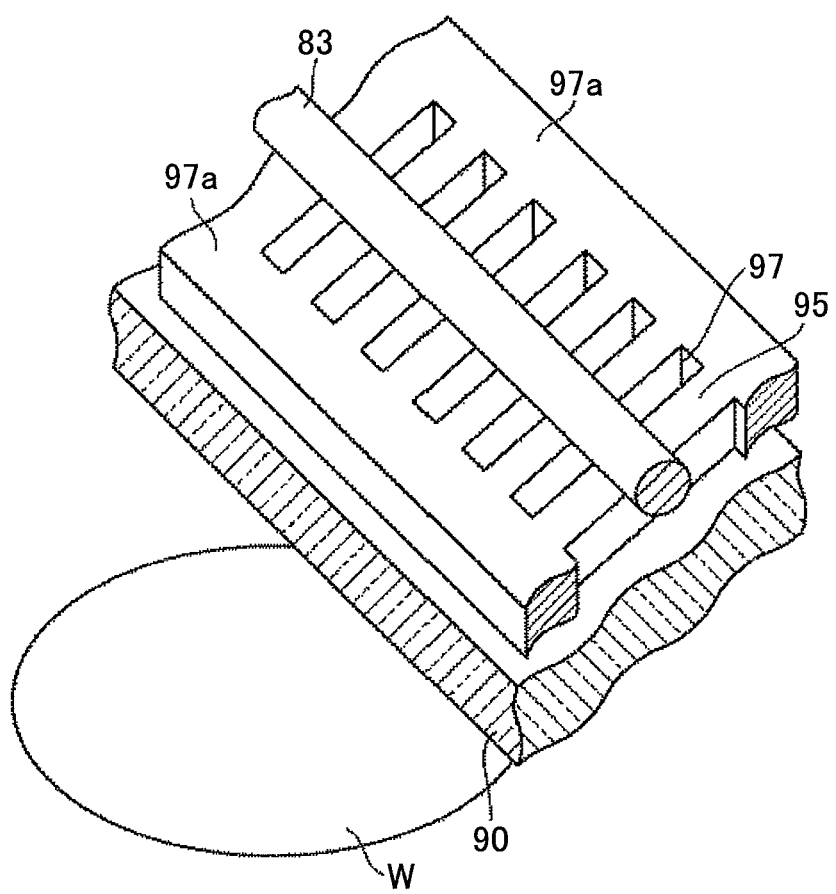
FIG. 8 is a perspective view illustrating a part of a Faraday shield provided in the plasma generator of the film deposition apparatus in FIG. 1.

FIG. 7 illustrates a plan view of an example of the plasma generator according to an embodiment, and FIG. 8 illustrates a perspective view of a part of the Faraday shield provided in the plasma generator according to an embodiment.

Upper end edges of the Faraday shield 95 on the right side and the left side extend rightward and leftward, respectively, when seen from the rotational center of the turntable 2 horizontally, and form supports 96. As illustrated in FIG. 5, a frame body 99 is provided between the Faraday shield 95 and the housing 90 to support the support 96 from below and so as to be supported by the flange part 90a of the housing 90 on the central area C and the outer periphery of the turntable 2.

When an electric field generated by the antenna 83 reaches the wafer W, a pattern (electrical wiring and the like) formed inside the wafer W may be damaged. Accordingly, as illustrated in FIG. 8, many slits 97 are formed in the horizontal surface 95a in order to prevent an electric field component of the electric field and a magnetic field (i.e., an electromagnetic field) generated by the antenna 83 from going toward the wafer W located below and to allow the magnetic field to reach the wafer W.

As illustrated in FIGS. 7 and 8, the slits 97 are formed under the antenna 83 along the circumferential direction so as to extend in a direction perpendicular to a winding direction of the antenna 83. Here, the slits 97 are formed to have a width dimension equal to or less than about 1/10000 of a wavelength of the radio frequency power supplied to the antenna 83. Moreover, electrically conducting paths 97a made of a grounded electric conductor and the like are arranged on one end and the other end in a lengthwise direction of each of the slits 97a so as to stop open ends of the slits 97a. An opening 98 is formed in an area out of the area where the slits 97 are formed in the Faraday shield 95, that is to say, at the central side of the area where the antenna 83 is wound around to be able to observe a light emitting state of the plasma therethrough. Here, in FIG. 2, the slits 97 are omitted for simplicity, and an example of the slit formation area is expressed by alternate long and short dash lines.

As illustrated in FIG. 5, an insulating plate 94 made of quartz and the like having a thickness dimension of, for example, about 2 mm, is stacked on the horizontal surface 95a of each of the Faraday shields 95 in order to ensure insulation properties from the plasma generators 81a and 81b placed on each of the Faraday shields 95. In other words, each of the plasma generators 81a and 81b is arranged so as to face the inside of the vacuum chamber 1 (the wafer W on the turntable 2) through the housing 90, the Faraday shield 95 and the insulating plate 94.

Thus, the first plasma generator 81a and the second plasma generator 81b have structures similar to each other, but installed heights are different from each other. In other words, the distance between the surface of the turntable 2 and the first plasma generator 81a and the distance between the surface of the turntable 2 and the second plasma generator 81b are different from each other. The heights of the plasma generators 81a and 81b can be readily made different from each other by adjusting the heights of the housings 90.

More specifically, the height of the first plasma generator 81a is set higher than the height of the second plasma generator 81b. As discussed above, the second process area P2 substantially closed by the housing 90 is formed in an area under the first plasma generator 81a, and the third process area P3 substantially closed by the housing 90 is formed in an area under the second plasma generator 81b. Hence, one of the plasma generators 81a and 81b having the smaller distance from the surface of the turntable 2, or positioned lower than the other, forms a smaller space under the housing 90 than the other. Here, when the distance between the first plasma generator 81a and the surface of the turntable 2 in the second process area P2 is made a first distance, and when the distance between the second plasma generator 81b and the surface of the turntable 2 is made a second distance, an amount of ions reaching the wafer W in the second process area P3 is more than that in the second process area P2 due to the second distance that is shorter than the first distance. Hence, an amount of radicals reaching the wafer W in the third process area P3 is more than that in the second process area P2.

In general, because $N_2$ converted to plasma has high energy but has a short life-span, the $N_2$ plasma does not reach the surface of the wafer W, which is disadvantageous for uniform nitriding and a modification process. However, by shortening the distance between the wafer W and the second plasma generator 81b, the plasma reaches the surface of the wafer W and the upper portion of the recessed pattern, which makes it possible to selectively form a non-adsorption site only on the surface of the wafer W and the upper portion of the recessed pattern. In other words, by utilizing $N_2$ gas for regional formation of the non-adsorption site, not for the whole nitriding, the nature of $N_2$ plasma having the high energy but the short life-span can be appropriately taken advantage of to deposit a film with high bottom-up characteristics.

The first distance between the first plasma generator 81a and the surface of the turntable 2 and the second distance between the second plasma generator 81b and the surface of the turntable 2 can be set to various values as long as the first distance is longer than the second distance. For example, the first distance may be set in a range of 80 to 150 mm, and the second distance may be set greater than or equal to 20 mm but less than 80 mm. However, the distances may be changed depending on the intended purpose, and are not limited to the above values.

Other components of the substrate processing apparatus according to the embodiment are described below again.

As illustrated in FIG. 2, a side ring 100 that forms a cover body is arranged at a position slightly lower than the turntable 2 and outer edge side of the turntable 2. Exhaust openings 61 and 62 are formed in an upper surface of the side ring 100 at two locations apart from each other in the circumferential direction. In other words, two exhaust ports are formed in a bottom surface of the vacuum chamber 1, and the exhaust openings 61 and 62 are formed at locations corresponding to the exhaust ports in the side ring 100.

In the present specification, one of the exhaust openings 61 and 62 is referred to as a first opening 61 and the other of the exhaust opening 62 is referred to as a second opening 62. Here, the first exhaust opening 61 is formed between the separation gas nozzle 42 and the first plasma generator 81a located downstream of the separation gas nozzle 42 in the rotational direction of the turntable 2. Furthermore, the second exhaust opening 62 is formed between the second plasma generator 81b and the separation area D located downstream of the plasma generator 81b in the rotational direction of the turntable 2.

The first exhaust opening 61 is to evacuate the first process gas and the separation gas, and the second exhaust opening 62 is to evacuate the plasma processing gas and the separation gas. Each of the first exhaust opening 61 and the second exhaust opening 62 is, as illustrated in FIG. 1, connected to an evacuation mechanism such as a vacuum pump 64 through an evacuation pipe 63 including a pressure controller 65 such as a butterfly valve.

As described above, because the housings 90 are arranged from the central area C side to the outer peripheral side, a gas flowing from the upstream side in the rotational direction of the turntable 2 to the plasma treatment area P2 and P3 may be blocked from going to the evacuation opening 62 by the housings 90. In response to this, a groove-like gas flow passage 101 (see FIGS. 1 and 2) is formed in the upper surface of the side ring 100 on the outer edge side of the housing 90 to allow the gas to flow therethrough.

As shown in FIG. 1, in the center portion on the lower surface of the ceiling plate 11, a protrusion portion 5 is provided that is formed into an approximately ring-like shape along the circumferential direction continuing from a portion close to the central area C of the convex portion 4 so as to have a lower surface formed as high as the lower surface of the convex portion 4 (ceiling surface 44). A labyrinth structure 110 is provided at a location closer to the rotational center of the turntable 2 than the protrusion portion 5 and above the core portion 21 to suppress the various gases from mixing with each other in the center area C.

As discussed above, because the housings 90 are formed even in a portion close to the central area C, a portion above the turntable 2 of the core portion 21 supporting the central portion of the turntable 2 is formed in an area close to the rotational center to avoid interfering with the housing 90. Due to this, the various gases are more likely to mix with each other in an area close to the central area C than an area close to the outer periphery. Hence, by forming the labyrinth structure 110 above the core portion 21, a flow path can be made longer to be able to prevent the gases from mixing with each other.

More specifically, the labyrinth structure 110 has a wall part vertically extending from the turntable 2 toward the ceiling plate 11 and a wall part vertically extending from the ceiling plate 11 toward the turntable 2 that are formed along the circumferential direction, respectively, and are arranged alternately in the radial direction of the turntable 2. In the labyrinth structure 110, for example, a source gas discharged from the source gas nozzle 31 and heading for the central area C needs to go through the labyrinth structure 110. Due to this, the source gas decreases in speed with the decreasing the distance from the central area C and becomes unlikely to diffuse. As a result, the source gas is pushed back by the separation gas supplied to the central area C before reaching the central area C. Moreover, other gases likely to head for the central area C are difficult to reach the central area C by the labyrinth structure 110 in the same way. This prevents the process gases from mixing with each other in the central area C.

On the other hand, the separation gas supplied from the separation gas supply pipe 51 is likely to diffuse swiftly in the circumferential direction at first, but decreases in speed as going through the labyrinth structure 110. In this case, nitrogen gas is likely to intrude into a very narrow area such as a gap between the turntable 2 and the projection portion 92, but flows to a relatively large area such as an area near the transfer opening 15 because the labyrinth structure 110 decreases the flowing speed thereof. Thus, nitrogen gas is prevented from flowing into a space under the housing 90.

As illustrated in FIG. 1, a heater unit 7 that is a heating mechanism is provided in a space between the turntable 2 and the bottom part 14 of the vacuum chamber 1. The heater unit 7 is configured to be able to heat the wafer W on the turntable 2 through the turntable 2 up to, for example, a range from room temperature to about 760 degrees C. Furthermore, as illustrated in FIG. 1, a side cover member 71a is provided on a lateral side of the heater unit 7, and an upper covering member 7a is provided so as to cover the heater unit 7 from above. In addition, purge gas supply pipes 73 for purging a space in which the heater unit 7 is provided are provided in the bottom part 14 of the vacuum chamber 1 under the heater unit 7 at multiple locations along the circumferential direction.

As illustrated in FIG. 2, a transfer opening 15 is formed in the side wall of the vacuum chamber 1 to transfer the wafer W between a transfer arm 10 that is not illustrated in the drawings and the turntable 2. The transfer opening 15 is configured to be hermetically openable and closable by a gate valve G.

The wafer W is transferred between the concave portion 24 of the turntable 2 and the transfer arm 10 that is not illustrated in the drawings at a position where the concave portion 24 of the turntable 2 faces the transfer opening 15. Accordingly, lift pins and an elevating mechanism that are not illustrated in the drawings are provided at a position under the turntable 2 corresponding to the transferring position to lift the wafer W from the back surface by penetrating through the concave portion 24.

Moreover, as illustrated in FIG. 1, a controller 120 constituted of a computer to control operation of the whole apparatus is provided in the substrate processing apparatus according to the present embodiment. A program to implement the substrate process described later is stored in a memory of the controller 120. This memory stores the program to perform the substrate process described later. This program is constituted of instructions of step groups to cause the apparatus to implement operations described later, and is installed into the controller 120 from a memory unit 121 that is a storage medium such as a hard disk, a compact disc, a magnetic optical disk, a memory card and a flexible disk.

[Film Deposition Method]

Next, a film deposition method for according to an embodiment of the present invention is described below. The film deposition method according to the embodiment can be implemented by using a variety of film deposition apparatuses as long as the film deposition apparatuses can deposit a film by ALD (Atomic Layer Deposition) or MLD (Molecular Layer Deposition). In the present embodiment, an example of performing the film deposition method by using the turntable type film deposition apparatus discussed above is described below.

In the present embodiment, an example in which the distance between plasma generator 81a and the turntable 2 in the second process area P2 for performing a first plasma process is set at 90 mm, and the distance between the plasma generator 81b and the turntable 2 in the third process area P3 for performing a second plasma process is set at 60 mm, is described below. Moreover, in the present embodiment, an example of using a mixed gas of DCS ($SiH_2Cl_2$, Dichlorosilane) and $N_2$ as a source gas supplied from the source gas nozzle 31, $NH_3$ as a first plasma processing gas supplied from the first plasma processing gas nozzle 32, and a mixed gas of $N_2$, Ar and $H_2$ as a second plasma processing gas supplied from the second plasma processing gas nozzle 33, is described below. However, the above-mentioned gases are cited as an example, and various kinds of Si-containing gases, various kinds of $NH_3$-containing gases and various kinds of $N_2$-containing gases can be used as the source gas, the first plasma processing gas and the second plasma processing gas, respectively.

Figure 9:
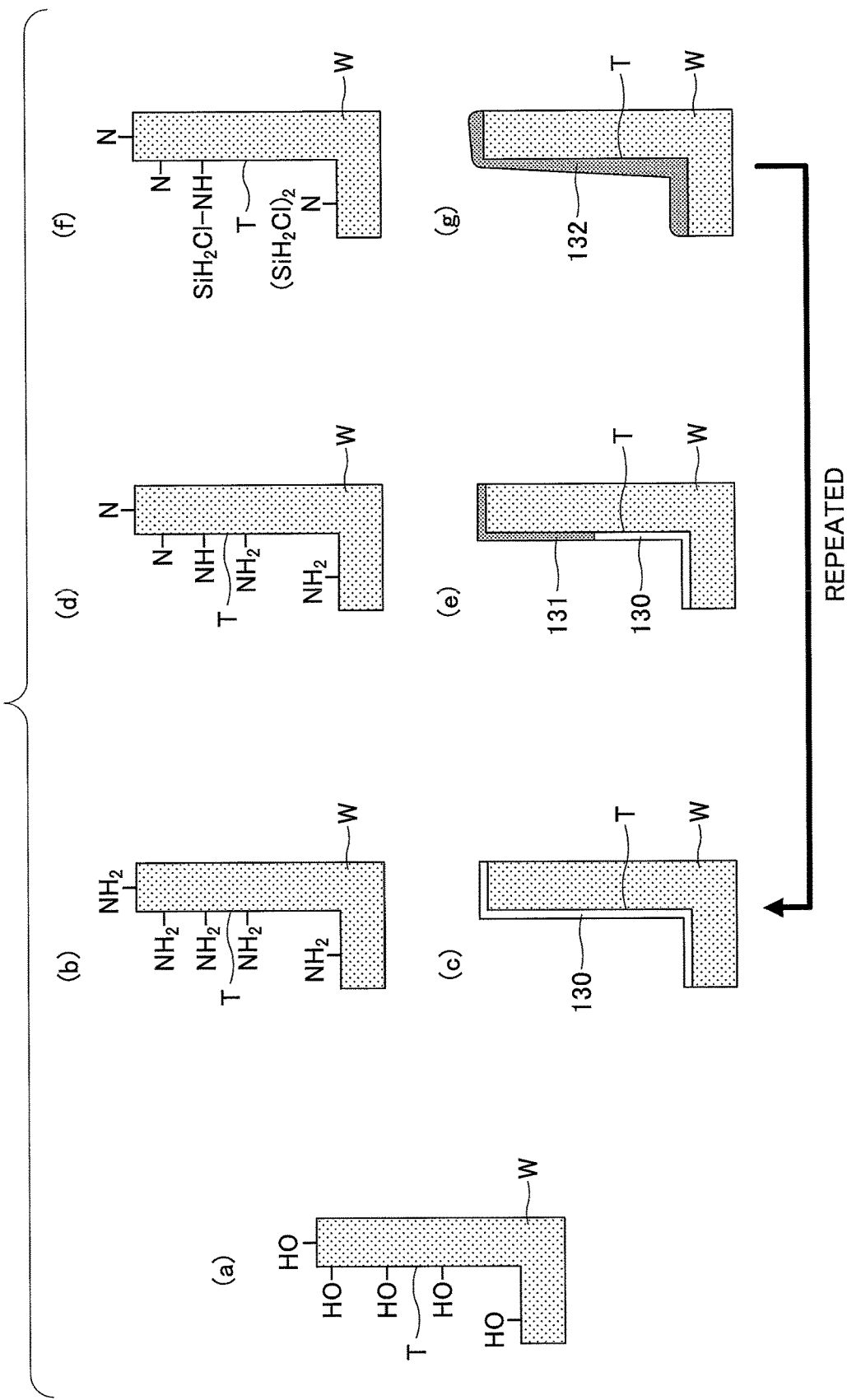
FIG. 9 is a diagram for explaining a film deposition method according to an embodiment of the present invention.

FIG. 9 is a diagram for explaining the film deposition method according to the embodiment.

Before performing the film deposition method, wafers W are carried into the vacuum chamber 1. More specifically, the gate valve G is opened. Then, the wafers W are placed on the turntable 2 by the transfer arm (not illustrated in the drawings) through the transfer opening 15 while rotating the turntable 2 intermittently.

Next, the gate valve G is closed and the wafers W are heated to a predetermined temperature by the heater unit 7. The temperature of the wafers is set at a temperature where nitriding surfaces of the wafers W can be performed by ammonia radicals, for example, at a temperature in a range of 400 to 800 degrees C. Subsequently, the source gas is discharged from the source gas nozzle 31 at a predetermined flow rate, and the first and second plasma processing gases are supplied from the first plasma processing gas nozzle 32 and the second plasma processing gas nozzle 33 at predetermined flow rates, respectively.

The inside of the vacuum chamber 1 is adjusted to a predetermined pressure by the pressure controller 65. The plasma generators 81a and 81b supply radio frequency power of predetermined outputs to antennas 83 thereof, respectively. For example, the radio frequency power may be set at 5 kW.

FIG. 9(*a*) is a diagram illustrating an example of an initial state of a wafer W. A recessed pattern such as a trench and a via hole is formed in a surface of the wafer W. Here, an example in which a trench T is formed in the surface of the wafer W is described below. As illustrated in FIG. 9(*a*), OH groups are adsorbed on the surface of the wafer W containing the trench T.

FIG. 9(*b*) is a diagram illustrating an example of a nitriding process. In the nitriding process, a $NH_3$-containing gas converted to plasma (first plasma processing gas) is supplied to the wafer W, and the surface of the wafer W containing the trench T is subject to nitriding. More specifically, when the turntable 2 is rotated, the wafer W passes through the second process area P2 and a mixed gas of $Ar/NH_3/H_2$ is supplied from the first plasma processing gas nozzle 32, and the mixed gas of $Ar/NH_3/H_2$ is converted to plasma by the plasma generator 81*a*. Nitriding the surface of the wafer W containing the trench T occurs by $NH_3$ converted to plasma, and $NH_2$ groups adsorb on the surface of the wafer W.

In the nitriding process, the $NH_3$-containing gas is supplied to the wafer W for uniformly nitriding the entire surface of the wafer W. $NH_3$ converted to plasma has a relatively long life-span as plasma, diffuse across the second process area P2, and reaches deep portions (bottom surfaces) of the trench T, thereby nitriding the whole surface of the wafer W containing the inside of the trench T. Because the life-span of $NH_3$ plasma is long, the distance between the plasma generator 81*a* and the turntable 2 is set relatively long so that the whole surface of the wafer W can be uniformly nitrided. Although the distance between the plasma generator 81*a* and the turntable 2 is set at 90 mm in the present embodiment, the distance can be set at various values as long as the distance is longer than the distance between the plasma generator 81*b* and the turntable 2 in the third process area P3. For example, the distance between the plasma generator 81*a* and the turntable 2 may be set in a range of 80 to 150 mm. Here, the distance between the plasma generator 81*a* and the turntable 2 can be set at various values by adjusting a distance between the housing 90 and the surface of the turntable 2, which is the height of the housing 90.

FIG. 9(*c*) is a diagram schematically illustrating a state of $NH_s$ groups adsorbed on the surface of the wafer W. As illustrated in FIG. 9(*c*), the $NH_2$ groups 130 are formed on the surface of the wafer W conforming to the recessed pattern containing the trench T.

FIG. 9(*d*) is a diagram illustrating an example of an adsorption site controlling process. In the adsorption site controlling process, an $N_2$-containing gas converted to plasma (second plasma processing gas) is supplied to the wafer W, and the $NH_2$ groups on an upper portion of the trench T and the top surface of the wafer W are converted to N groups. More specifically, the wafer passes through the third process area P3 due to the rotation of the turntable 2, and a mixed gas of $N_2/Ar/H_2$ is supplied to the wafer W from the second plasma processing gas nozzle 33, and the mixed gas of $N_2/Ar/H_2$ is converted to plasma by the plasma generator 81*b*. Because a life-span of $N_2$ converted to plasma is relatively short, $N_2$ plasma does not reach a deep portion of the trench T, and removes H groups from the $NH_2$ groups so as to convert the $NH_2$ groups to N groups only at the upper portion of the trench T and the top surface of the wafer W. The $NH_2$ groups serve as adsorption groups for the source gas such as DCS, but the N groups serve as non-adsorption groups. Hence, the non-adsorption site is formed on the upper portion of the trench T and the top surface of the wafer W, and the adsorption site of the $NH_2$ groups is formed on and around the bottom portion of the trench T.

Here, because the life-span of $N_2$ plasma is short, the distance between the plasma generator 81*b* and the turntable 2 is set shorter than the distance between the plasma generator 81*a* and the turntable 2 in the second process area P2. Although the distance between the plasma generator 81*b* and the turntable 2 is set at 60 mm in the present embodiment, the distance can be set at various values as long as the distance is shorter than the distance between the plasma generator 81*a* and the turntable 2 in the second process area P2. For example, the distance between the plasma generator 81*b* and the turntable 2 may be set longer than or equal to 20 mm and shorter than 80 mm.

In order to remove only the H groups from the $NH_2$ groups on the upper portion of the trench T and to convert the $NH_2$ groups to the N groups, a flow rate of $N_2$, a magnitude of the radio frequency power, the distance between the plasma generator 81*b* and the surface of the turntable 2 and the like may be set at appropriate values by properly changing a variety of conditions.

Although the mixed gas of $N_2/Ar/H_2$ is used as the second plasma processing gas in the present embodiment, a variety of $N_2$-containing gases may be used as long as the gases contain $N_2$.

FIG. 9(*e*) is a diagram schematically illustrating a state of $NH_2$ groups 130 part of which is converted to N groups 131. As illustrated in FIG. 9(*e*), the $NH_2$ groups formed on the upper portion of the trench T and the top surface of the wafer W are converted to the N groups 131.

Next, the wafer W passes through the area under the separation area D due to the rotation of the turntable 2, and is purged by the separation gas supplied thereto. Here, $N_2$, Ar and the like are used as the separation gas (purge gas). The wafer W reaches the first process area P1 after passing through the separation area D.

FIG. 9(*f*) is a diagram illustrating an example of a source gas adsorption process. In the source gas adsorption process, a source gas is supplied to the wafer W, and the source gas selectively adsorbs on the $NH_2$ groups 130 in the trench T. More specifically, the wafer passes through the first process area P1 and DCS is supplied from the source gas nozzle 31. DCS adsorbs on the $NH_2$ groups, but does not adsorb on the N groups. Thus, DCS adsorbs only on and around the bottom surface of the trench T.

FIG. 9(*g*) is a diagram schematically illustrating a state of DCS selectively adsorbed on the surface of the wafer W. As illustrated in FIG. 9(*g*), DCS 132 is adsorbed on and around the bottom surface of the trench T but not adsorbed on the upper portion of the trench T and the top surface of the wafer W very much. Hence, DCS 132 is deposited into the trench T from the bottom. Thus, the film deposition method according to the present embodiment can cause DCS 132 to selectively adsorb on the surface of the trench T and can perform the bottom-up filling deposition.

Next, the wafer W passes through an area under the separation area D due to the rotation of the turntable 2, and is purged by the separation gas supplied thereto. After that, the wafer reaches the second process area P2.

When the wafer w passes through the second process area P2, the nitriding process described in FIGS. 9(*b*) and (*c*) is performed again. After that, the nitriding process, the adsorption site controlling process and the source gas adsorption process described in FIGS. 9(*b*)-(*g*) are performed on the wafer W repeatedly along with the rotation of the turntable 2, and the bottom-up filling deposition is performed so as to deposit the film from the bottom surface in the trench T. Subsequently, a SiN film is deposited into the trench T, and the film deposition process ends when the trench is filled up with the SiN film. Thus, the film deposition according to the embodiment of the present invention ends.

After the film deposition process ends, the supply of the gases from the gas nozzles 31 through 33, 41 and 42 is stopped, and the rotation of the turntable 2 is stopped. Then, the gate valve G is opened, and the wafer W subject to the film deposition process is carried out of the transfer opening 15 by using the transfer arm (not illustrated in the drawings). After all wafers W are carried out, all of the film deposition process ends. As necessary, the next wafer to be processed is carried in, and the film deposition process is performed similarly.

Thus, film deposition method according to the embodiments of the present invention can fill a recessed pattern such as a trench T and a via hole with a silicon nitride film with superior bottom-up characteristics, thereby preventing a void from being generated in the silicon nitride film.

Figure 10:
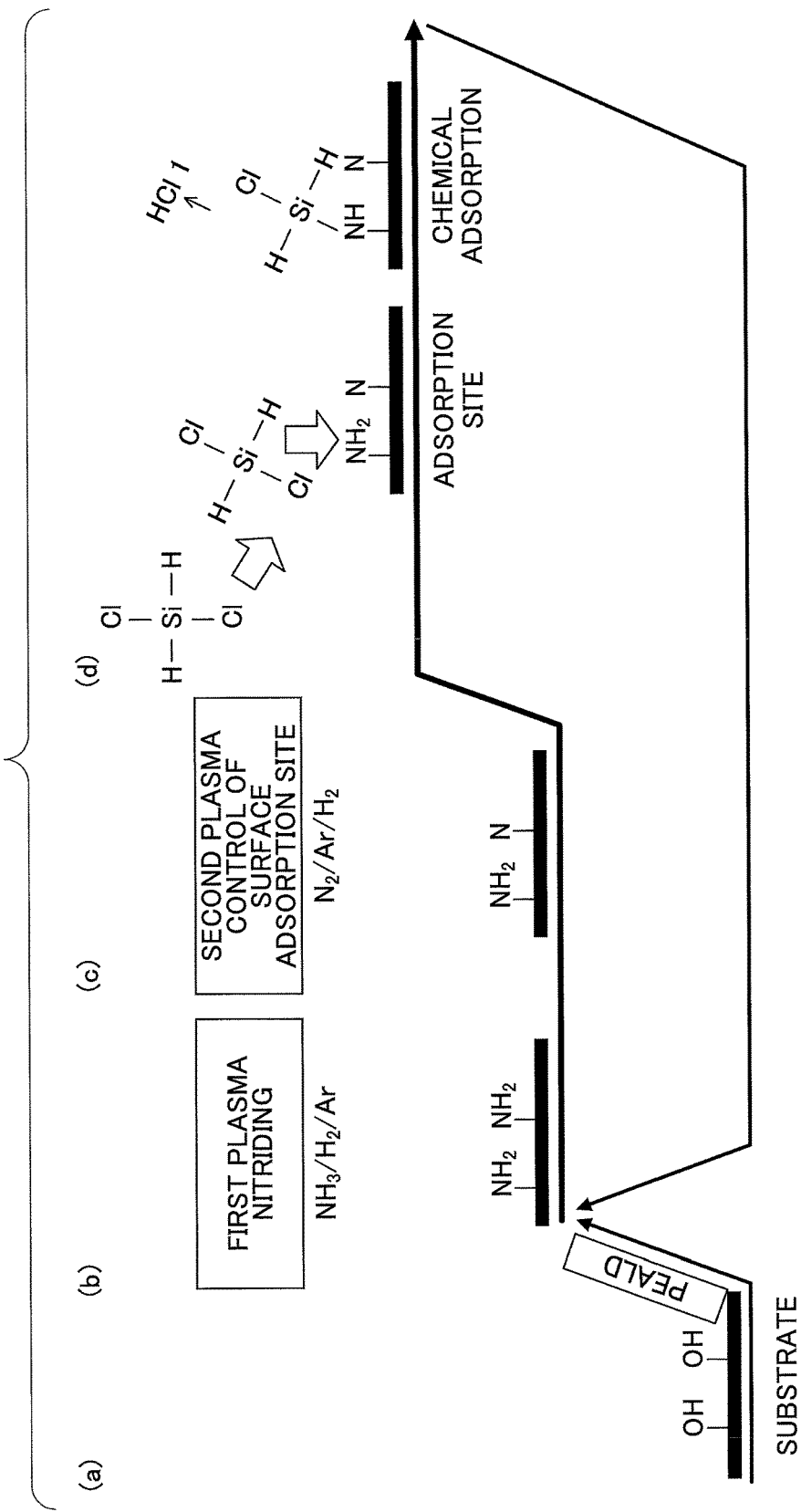
FIG. 10 is a diagram illustrating the film deposition method explained in FIG. 9 by using a reaction model.

FIG. 10 is a diagram illustrating the film deposition method described in FIG. 9 by using a reaction model.

FIG. 10(a) is a diagram illustrating an example of an initial surface state of a wafer W. In the initial state, OH groups are formed on the surface of the wafer W.

FIG. 10(b) is a diagram illustrating an example of a surface state of the wafer W in the nitriding process. In the nitriding process, a mixed gas of $NH_3/H_2/Ar$ converted to plasma is supplied to the surface of the wafer W, and $NH_2$ groups are formed on the surface of the wafer W.

FIG. 10(c) is a diagram illustrating an example of a surface state of the wafer W in the adsorption site controlling process. In the adsorption site controlling process, a mixed gas of $N_2/H_2/Ar$ converted to plasma is supplied to the surface of the wafer W, and part of the $NH_2$ groups is converted to N groups while a modification is performed. Here, the formation of the adsorption site and the non-adsorption site is controlled with respect to a depth direction of a trench. In other words, the non-adsorption site is formed on the upper portion of the trench, and the adsorption site is left on the middle portion and the lower portion of the trench.

FIG. 10(d) is a diagram illustrating an example of a surface state of the wafer W in the source gas adsorption process. In the source gas adsorption process, DCS ($SiH_2Cl_2$) that is the source gas is supplied to the surface of the wafer W, DCS does not adsorb on N groups but selectively adsorbs on the $NH_2$ groups that is the adsorption site by chemical adsorption. Thus, selective filling deposition can be performed.

After that, FIGS. 10(b)-(d) are repeated, and the trench is gradually filled with a SiN film.

Working Example

Figure 11:
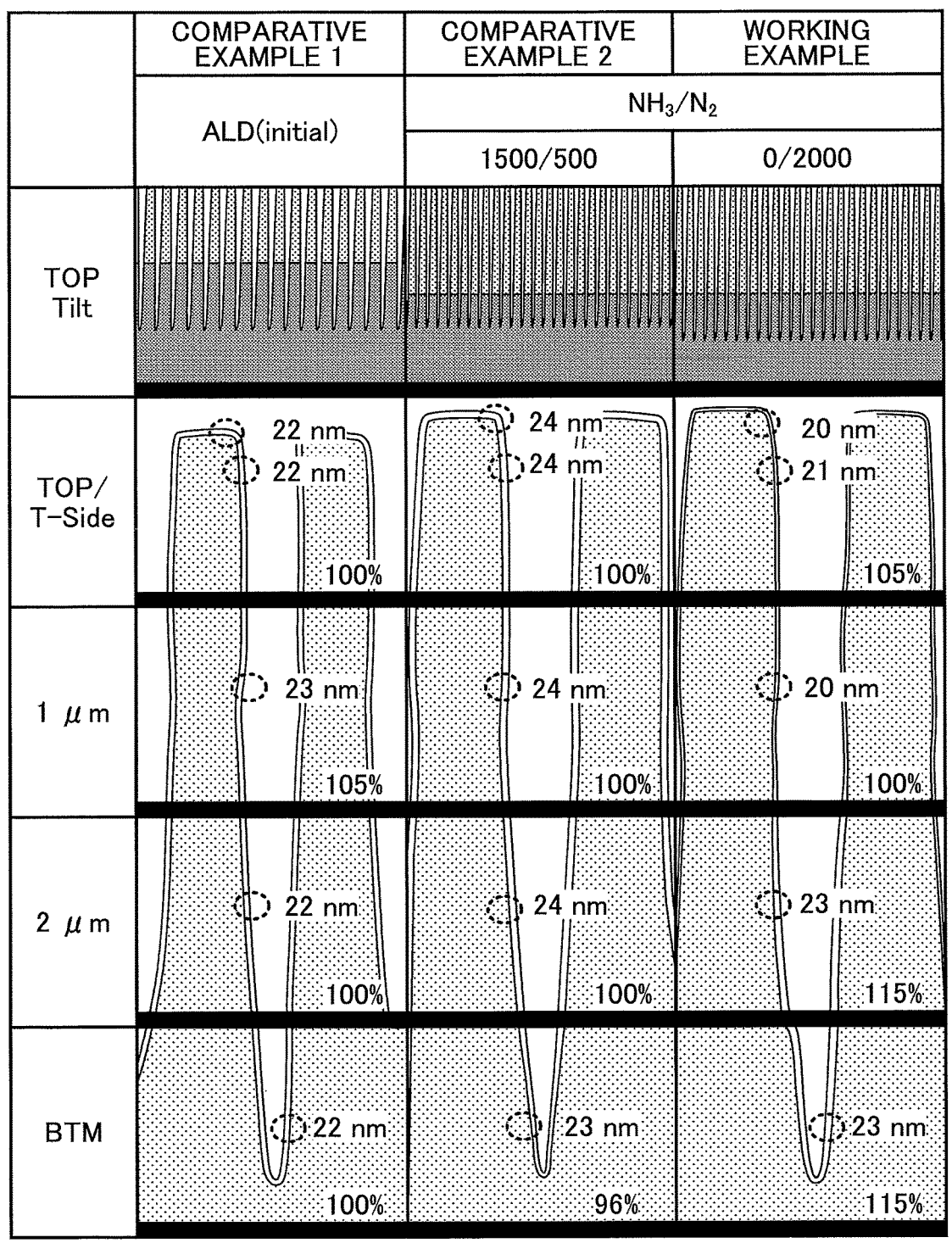
FIG. 11 is a diagram showing a result of a working example performing the film deposition method according to an embodiment of the present invention with a result of a comparative example.

FIG. 11 is a diagram showing a result of a working example in which the film deposition method according to the embodiment of the present invention was performed with results of comparative examples. FIG. 11 shows the results of the working example and comparative examples 1 and 2.

The film deposition method of the working example was performed by using the above-mentioned turntable type film deposition apparatus. The distance between the plasma generator 81a and the surface of the turntable 2 in the second process area P2 was set at 90 mm, and the distance between the plasma generator 81b and the surface of the turntable 2 in the third process area P3 was set at 60 mm. The output of the radio frequency power source was set at 5 kW. The first plasma processing gas nozzle 32 in the second process area P2 supplied a mixed gas of $NH_3/H_2/Ar$ at flow rates of 300/600/2000 sccm.

The second plasma processing gas nozzle 33 in the third process area P3 supplied a mixed gas of $NH_3/N_2/Ar$ by changing flow rates. In the comparative example 1, the flow rates of $NH_3/N_2/Ar$ was made equal to 2000/0/2000 sccm ($NH_3/N_2$=2000/0 sccm). In the comparative example 2, the flow rates of $NH_3/N_2/Ar$ was made equal to 1500/500/2000 sccm ($NH_3/N_2$=1500/500 sccm). In the working example, the flow rates of $NH_3/N_2/Ar$ was made equal to 0/1500/2000 sccm ($NH_3/N_2$=0/2000 sccm).

The comparative example 1 is an example of using only $NH_3$ as the nitriding gas of the second plasma processing gas, and the comparative example 2 is an example of using a mixed gas of $NH_3/N_2$ as the nitriding gas of the second plasma processing gas while increasing the flow rate of $NH_3$. The working example is an example of using only $N_2$ as the nitriding gas of the second plasma processing gas.

FIG. 11 shows trenches after performing the comparative examples 1 and 2 and the working example, and a film thickness of 22 nm in the comparative example 1 was made a reference state. In FIG. 11, locations where the film thicknesses were measured were shown by circles drawn by a dashed line, and the film thicknesses at the locations were written.

In the comparative example 2, compared to the comparative example 1, the film thickness of a bottom portion BTM was 96%, and the film thicknesses at the other locations were 100%. Hence, the film was formed a little thicker on the upper portion than on the bottom portion.

In contrast, in the working example, the film thicknesses on a bottom portion BTM and a portion expressed by 2 μm and the second from the bottom were 115%, which were deposited thicker than the film thicknesses of 100% and 105% at the upper portion. Thus, FIG. 11 indicated that the film deposition method according to the present embodiment can perform selective filling deposition and filling deposition with superior bottom-up characteristics.

As discussed above, according to the embodiments of the present invention, filling deposition with superior bottom-up characteristics can be performed in a recessed pattern formed in a surface of a substrate.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:
1. A film deposition method for filling a recessed pattern formed in a surface of a substrate with a SiN film, comprising steps of:
 causing $NH_2$ groups to adsorb on a surface of a substrate containing a recessed pattern formed in a top surface of the substrate by supplying a first process gas containing

NH$_3$ converted to first plasma to the surface of the substrate containing the recessed pattern;

partially converting the NH$_2$ groups to N groups by supplying a second process gas containing N$_2$ converted to second plasma to the surface of the substrate containing the recessed pattern on which the NH$_2$ groups is adsorbed; and causing a silicon-containing gas to adsorb on the NH$_2$ groups by supplying the silicon-containing gas to the surface of the substrate containing the recessed pattern on which the NH$_2$ groups and the N groups are adsorbed; and cyclically repeating the steps of causing the NH$_2$ groups to adsorb on the surface of the substrate, partially converting the NH$_2$ groups to the N groups and causing the silicon-containing gas to adsorb on the NH$_2$ groups, wherein the first plasma is generated at a first height higher and more distant from the top surface of the substrate than a second height at which the second plasma is generated, the first height being set at a height that causes the first plasma containing NH$_3$ to reach a bottom of the recessed pattern, the second height being set at a height that causes the second plasma containing N$_2$ to reach only an upper portion of the recessed pattern and the top surface of the substrate.

2. The film deposition method as claimed in claim 1, wherein the NH$_2$ groups adsorbed on an upper portion of the recessed pattern and the top surface of the substrate W is converted to the N groups in the step of partially converting the NH$_2$ groups to the N groups.

3. The film deposition method as claimed in claim 1, wherein the first process gas is a gas that does not contain N$_2$.

4. The film deposition method as claimed in claim 3, wherein the first process gas and the second process gas further contain Ar and H$_2$.

5. The film deposition method as claimed in claim 1, wherein the silicon-containing gas contains any one of dichlorosilane, disilane, hexachlorodisilane, diisopropylamino-silane, tris(dimethylamino)silane, bis(tertiary-butylamino)silane.

6. The film deposition method as claimed in claim 1, wherein a temperature of the substrate is set higher than or equal to 400 degrees C. at which nitriding the surface of the substrate containing the recessed pattern can be performed by ammonia radicals.

7. The film deposition method as claimed in claim 1, wherein the second process gas converted to the second plasma has energy higher than energy of the first process gas converted to the first plasma.

8. The film deposition method as claimed in claim 1, further comprising:

supplying a purge gas to the surface of the substrate containing the recessed pattern between the steps of partially converting the NH$_2$ groups to the N groups and causing the silicon-containing gas to adsorb on the NH$_2$ groups, and between the steps of causing the silicon-containing gas to adsorb on the NH$_2$ groups and causing the NH$_2$ groups to adsorb on the surface of the substrate.

9. The film deposition method as claimed in claim 8, wherein the substrate is arranged on a turntable provided in a process chamber along a circumferential direction of the turntable, wherein the process chamber includes a first plasma processing area for performing the step of causing the NH$_2$ groups to adsorb on the surface of the substrate, a second plasma processing area for performing the step of partially converting the NH$_2$ groups to the N groups, a first purge area for performing the step of purging the surface of the substrate, an adsorption area for performing the step of causing the silicon-containing gas to adsorb on the NH$_2$ groups, and a second purge area for performing the step of purging the surface of the substrate, arranged along a rotational direction of the turntable and above the turntable, and wherein the steps of causing the NH$_2$ groups to adsorb on the surface of the substrate, partially converting the NH$_2$ groups to the N groups, purging the surface of the substrate, causing the silicon-containing gas to adsorb on the NH$_2$ groups, and purging the surface of the substrate, are performed on the surface of the substrate containing the recessed pattern by rotating the turntable.

10. The film deposition method as claimed in claim 9, wherein a first plasma generator and a second plasma generator are provided above the first plasma processing area and the second plasma processing area, respectively, and wherein the first plasma generator is disposed higher than the second plasma generator so as to generate the first plasma at a first height that is higher than a second height at which the second plasma is generated.

* * * * *